(12) United States Patent
Liu

(10) Patent No.: US 7,425,755 B2
(45) Date of Patent: Sep. 16, 2008

(54) SEMICONDUCTOR PACKAGE, METHOD FOR MANUFACTURING THE SAME AND LEAD FRAME FOR USE IN THE SAME

(75) Inventor: Sheng Tsung Liu, Kaohsiung (TW)

(73) Assignee: Advanced Semiconductor Engineering Inc., Pingtung (TW)

( * ) Notice: Subject to any disclaimer, the term of this patent is extended or adjusted under 35 U.S.C. 154(b) by 0 days.

(21) Appl. No.: 10/974,690

(22) Filed: Oct. 28, 2004

(65) Prior Publication Data

US 2005/0093177 A1    May 5, 2005

(30) Foreign Application Priority Data

Oct. 29, 2003    (TW) .............. 92130070 A

(51) Int. Cl.
H01L 23/495    (2006.01)
(52) U.S. Cl. .............. 257/666; 257/676; 257/E23.043; 257/E23.047; 257/E23.048
(58) Field of Classification Search ........... 257/E23.047
See application file for complete search history.

(56) References Cited

U.S. PATENT DOCUMENTS

| | | | | |
|---|---|---|---|---|
| 5,157,480 A * | 10/1992 | McShane et al. | ............ | 257/693 |
| 5,309,020 A * | 5/1994 | Murasawa et al. | .......... | 257/685 |
| 5,633,530 A * | 5/1997 | Hsu | ............................ | 257/685 |
| 5,801,439 A * | 9/1998 | Fujisawa et al. | ............. | 257/686 |
| 5,835,988 A * | 11/1998 | Ishii | ............................. | 257/684 |
| 5,866,939 A * | 2/1999 | Shin et al. | .................... | 257/666 |
| 5,986,209 A * | 11/1999 | Tandy | ........................ | 174/52.4 |
| 6,043,430 A * | 3/2000 | Chun | .......................... | 174/530 |
| 6,153,928 A * | 11/2000 | Cho | ............................. | 257/686 |
| 6,313,598 B1 * | 11/2001 | Tamba et al. | ................. | 318/722 |
| 6,424,031 B1 * | 7/2002 | Glenn | ......................... | 257/686 |
| 6,433,418 B1 * | 8/2002 | Fujisawa et al. | ............ | 257/696 |
| 6,605,866 B1 * | 8/2003 | Crowley et al. | ............. | 257/692 |
| 6,661,087 B2 * | 12/2003 | Wu | ............................. | 257/692 |
| 6,730,544 B1 * | 5/2004 | Yang | .......................... | 438/110 |
| 6,781,243 B1 * | 8/2004 | Li et al. | ....................... | 257/777 |
| 6,876,066 B2 * | 4/2005 | Fee et al. | ..................... | 257/666 |
| 6,972,479 B2 * | 12/2005 | Chen et al. | ................... | 257/666 |
| 7,049,684 B2 * | 5/2006 | Minamio et al. | ............ | 257/666 |
| 2002/0100963 A1 * | 8/2002 | Suzuki et al. | ................ | 257/678 |
| 2002/0140068 A1 * | 10/2002 | Lee et al. | ..................... | 257/676 |
| 2002/0153599 A1 * | 10/2002 | Chang et al. | ................. | 257/676 |
| 2002/0153601 A1 * | 10/2002 | Chang et al. | ................. | 257/678 |
| 2003/0038347 A1 * | 2/2003 | Chiu et al. | ................... | 257/678 |
| 2003/0042581 A1 * | 3/2003 | Fee et al. | ..................... | 257/666 |
| 2003/0067057 A1 * | 4/2003 | Wu | ............................. | 257/666 |
| 2003/0146501 A1 * | 8/2003 | Sasaki et al. | ................ | 257/692 |

(Continued)

*Primary Examiner*—Andy Huynh
*Assistant Examiner*—Hoang-Quan Ho

(57) ABSTRACT

A semiconductor package mainly includes a semiconductor chip and a plurality of leads at the periphery of the semiconductor chip. Each of the leads has a first portion, a second portion and opposing upper and lower surfaces, wherein the second portion of the leads are bent upwards. The semiconductor package has a plurality of bonding wires with one ends connected to the bonding pads of the semiconductor chip and the other ends connected to the first portions of the leads. The semiconductor package is provided with a package body formed over the semiconductor chip and the leads, wherein each of the leads is substantially embedded in the package body with the lower surface thereof exposed from the package body. The present invention further provides a method for manufacturing the semiconductor package.

12 Claims, 3 Drawing Sheets

U.S. PATENT DOCUMENTS

| | | | |
|---|---|---|---|
| 2003/0197290 A1* | 10/2003 | Crowley et al. | 257/787 |
| 2003/0222331 A1* | 12/2003 | Lee et al. | 257/676 |
| 2004/0016994 A1* | 1/2004 | Huang | 257/676 |
| 2004/0089921 A1* | 5/2004 | Minamio et al. | 257/666 |
| 2004/0145043 A1* | 7/2004 | Hayashi et al. | 257/696 |
| 2005/0093117 A1* | 5/2005 | Masuda et al. | 257/676 |
| 2005/0127494 A1* | 6/2005 | Liu | 257/696 |
| 2006/0017173 A1* | 1/2006 | Wu et al. | 257/778 |
| 2006/0175688 A1* | 8/2006 | Jang | 257/666 |

* cited by examiner

SEMICONDUCTOR PACKAGE, METHOD FOR MANUFACTURING THE SAME AND LEAD FRAME FOR USE IN THE SAME

This application claims the priority benefit of Taiwan Patent Application Serial Number 092130070 filed Oct. 29, 2003, the full disclosure of which is incorporated herein by reference.

FIELD OF THE INVENTION

The present invention relates to a lead frame package.

BACKGROUND OF THE INVENTION

Because of low price and high reliability, a lead frame package has been used in the field of the ICs package for a long time. However, as ICs products are endlessly speeded and shrank, the conventional lead frame package has become unfashionable, at least for some efficiency-concerned ICs products. Therefore, the ball grid array (BGA) and chip scale package (CSP) have become a new choice for package. The BGA is widely applied to chips with large I/Os and chips that need better electronic properties and heat efficiency (for example, central processing unit and graphic chips). The CSP has also been wildly used in portable products, having main concerns for footprints, package profile and package weight.

However, for small I/Os the lead frame package still occupies the quite large market share, because it provides the solutions of the low cost efficiency. Because of having quite long inner leads and outer leads, the conventional lead frame package cannot provide the chip-scaled, small package volume solutions. Thus, the semiconductor package industry created a leadless package of which the footprint and package volumes are shrank tremendously.

FIG. 1 is the cross section of a known leadless package 10. Compared with the known gull-wing and J-leaded type packages, a plurality of leads 11a of the leadless package 10 is placed under the bottom of the leadless package. The chip carrier 11b of the leadless package 10 is exposed in the package bottom to provide better heat-radiating efficiency. The chip 12 is attached to the chip carrier 11b by using silver epoxy, and the chip 12 is electrically connected to a plurality of leads 11a.

Eliminating the outer leads, the leadless package 10 has the features of low profile and low weight. Besides, because the lead length decrease results in the comparative decrease in resistance, inductance and capacitance, the leadless package 10 is very suitable for the high frequency package operated at several Giga Hertz to tens of Giga Hertz. Due to the current well-developed materials, the leadless package is a very price-competitive package technology. The above-mentioned properties make the leadless package very suitable for communication products (for example, mobile phone), portable products (for example, personal digital assistance, PDA), digital camera and information appliances (IA).

The package 10 is generally installed in a substrate, for example, a printed circuit board, by the surface mount technology (SMT). In details, the exposed leads 11a in the bottom of the package 10 are mounted to the corresponding pads 18 on the printed circuit board 16 by the solders 14. The current problem in the SMT operation of the known leadless package is that the exposed area of the lead 11a in the bottom of the package 10 is too small so that the soldering quality and reliability are significantly decreased. Although the fillet height can be increased through increasing the thickness of the lead 11a, the thickness of the lead 11a is confined (generally to about 0.15 mm) because the low profile is generally necessary for the leadless package. As shown in FIG. 1, the lead 11a on a side of the package may provide the height of only 0.15 mm for soldering. It leads to bad soldering strength.

SUMMARY OF THE INVENTION

The object of the present invention is to provide a semiconductor package that efficiently increases the fillet height without inverse effect on the total thickness of the package so as to increase the soldering strength and overcome or at least solve the above-mentioned problems of the prior technology.

A semiconductor package of one embodiment in accordance with the present invention mainly comprises a semiconductor chip and a plurality of leads disposed in the periphery of the semiconductor chip. Each lead has a first portion, a second portion that curves upwards and opposing upper and lower surfaces. The semiconductor package has a plurality of bonding wires with one end connected to a chip-bonding pad on the active area of the semiconductor chip and the other end connected to the first portion of the lead. The semiconductor package is provided with a package body formed over the semiconductor chip and the leads, wherein the whole lead is substantially embedded in the package body with the lower surface of the leads exposed outside of the package body. It should be appreciated that the lower surface of the first portion of the lead is exposed on the lower surface of the semiconductor package and the lower surface of the second portion of the lead is exposed on a side of the semiconductor package.

The semiconductor package may also comprise a die pad that is coplanar with the first portion of the lead and is used to carry the semiconductor chip. The second portion of the lead may comprise a protrusion. Under this circumstance, preferably, the package body encloses the substantially total surface of the protrusion so as to make the package body and the leads combine with each other more stably.

The present invention also provides the method for manufacturing the semiconductor package. First, a thin metal strip is etched or pressed to form a die pad having a plurality of leads with a fist portion and second portion. Then, the die pad and the fist portion of the lead are recessed to let them be on a plane that is parallel to and below a plane of the lead frame. After attaching a semiconductor chip onto the die pad of the lead frame, the first portion of the lead is electrically connected to the semiconductor chip. Finally, a package body is formed to enclose the semiconductor chip and the lead frame so as to make the lead substantially embedded in the package body and the lower surface of the lead is exposed outside of the package body.

When the above-mentioned package is mounted onto a substrate (for example, a printed circuit board) by the surface mount technology (SMT), the first portion of the lead exposed in the bottom of the package and the second portion of the lead exposed on a side of the package are mounted to the corresponding pads over the printed circuit board. Compared to the conventional leadless package, the second portion of the lead, which curves upward, in accordance with the present invention, is exposed on a side of the package. It may efficiently increase the fillet height. However, the total thickness of the package of the present invention can still keep equivalent to the conventional leadless package. Besides, the package in accordance with the present invention merely needs to have the first portion of the lead of the conventional lead frame and the die pad recessed so as to form a lead frame with leads having a portion that curves upward. Therefore, the package in accordance with the present invention can use the current and well-developed bill of materials (BOM) to make the package of the present invention more price-competitive.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
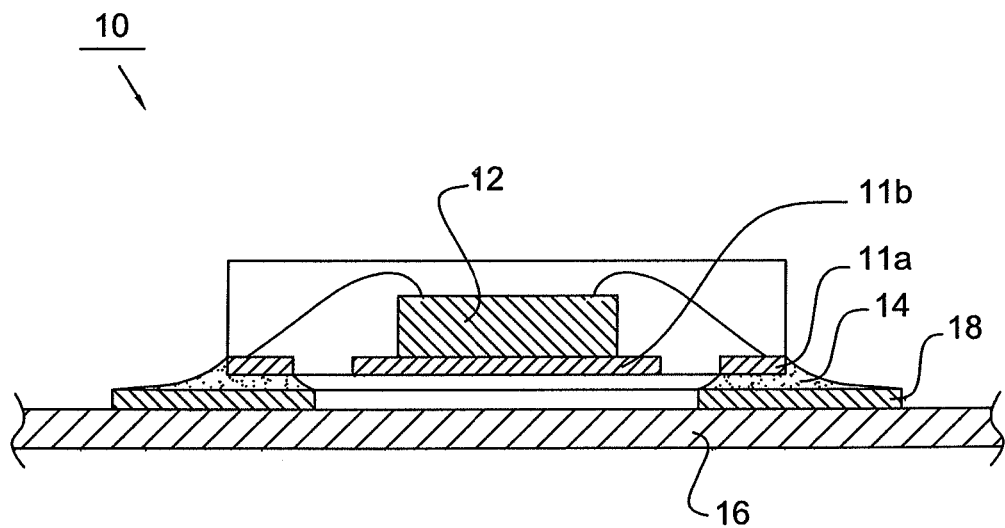
FIG. 1 shows the cross section of the known package of no outer lead, installed in an outer substrate.
Figure 2:
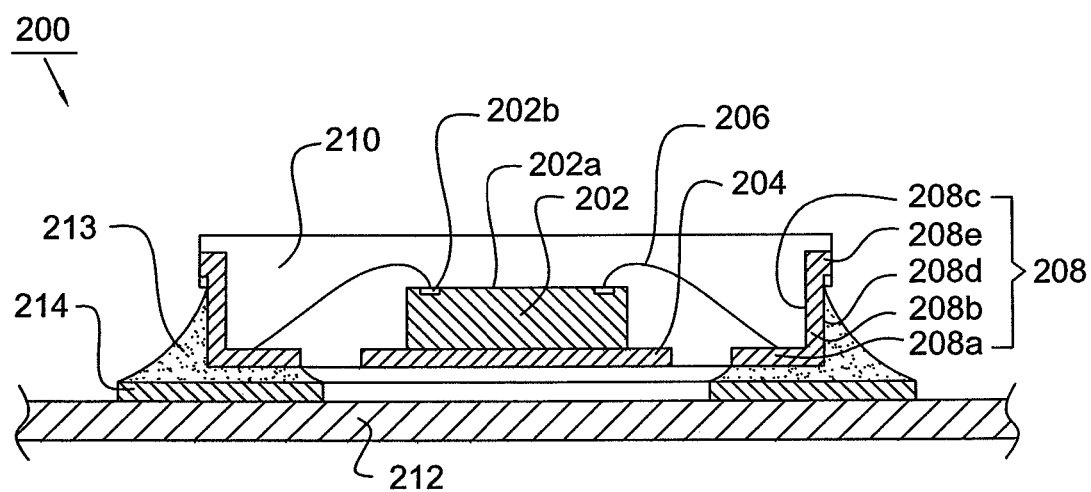
FIG. 2 shows the cross section of the package, installed in an outer substrate, of one embodiment in accord with the present invention.

FIG. 2 discloses a semiconductor package 200 of one embodiment in accordance with the present invention. It comprises a semiconductor chip 202 that is attached to a die pad 204 by a conductive resin or non-conductive resin, for example, epoxy resin (not shown in the figure). The active area 202a of the semiconductor chip 202 has a plurality of bonding pads 202b. A plurality of leads 208 are placed in the periphery of the semiconductor chip 202. Each of the leads 208 has a first portion 208a, a second portion 208b that curves upwards and opposing upper surface 208c and lower surface 208d. A plurality of bonding wires 206 each having one end connected to the first portion 208a of the L-shaped lead 208 and the other end connected to the bonding pad 202b of the semiconductor chip 202. The second portion 208b of the lead 208 may comprise a protrusion 208e. A package body 210 encloses the semiconductor chip 202 and leads 208, wherein the whole lead 208 is substantially embedded in the package body 210 with the lower surface 208d of the lead 208 exposed outside of the package body 210. Preferably, the package body 210 encloses the substantially overall surface of the protrusion 208e so as to make the package body 210 and leads 208 combined with each other more stably. It should be noted that the lower surface of the first portion 208a of the lead 208 is exposed on the lower surface of the semiconductor package and the lower surface 208d of the second portion 208b of the lead 208 is exposed on a side of the semiconductor package.

The package 200 is mounted onto an outer substrate, for example, a printed circuit board 212, by the surface mount technology (SMT). The printed circuit board 212 may first be screen printed with the solder paste in the pattern corresponding to the first portion 208a of the lead 208 of the bottom of the package 200. Then, the package 200 is directly mounted onto the printed circuit board 212 and reflow by conventional surface mount technology. It is understood that the first portion 208a of the lead 208 exposed in the bottom of the package 200 may also be printed with the solder paste and then mounted onto the substrate.

Referring to FIG. 2, the first portion 208a of the lead 208 exposed in the bottom of the package 200 is mounted to the corresponding bonding pad 214 on the printed circuit board 212 by the solder 213. As shown in the figure, because the second portion 208b of the lead 208 curves upward to efficiently increase the fillet height, therefore the soldering strength between the package 200 and the printed circuit board 212 may be increased tremendously, and the reliability of soldering is efficiently increased. Of course, it is understood that the longer the second portion 208b of the lead 208, the higher the fillet height. But under the consideration of the factors of cost and package thickness, the length of the second portion 208b of the lead 208 of the present invention is preferably designed to be consistent with the package thickness.

Compared with the conventional leadless package, the second portion 208b of the lead 208 in accordance with the present invention can efficiently increase the fillet height. However, the total thickness of the package of the present invention can still keep equivalent to the conventional leadless package.

Figure 3:
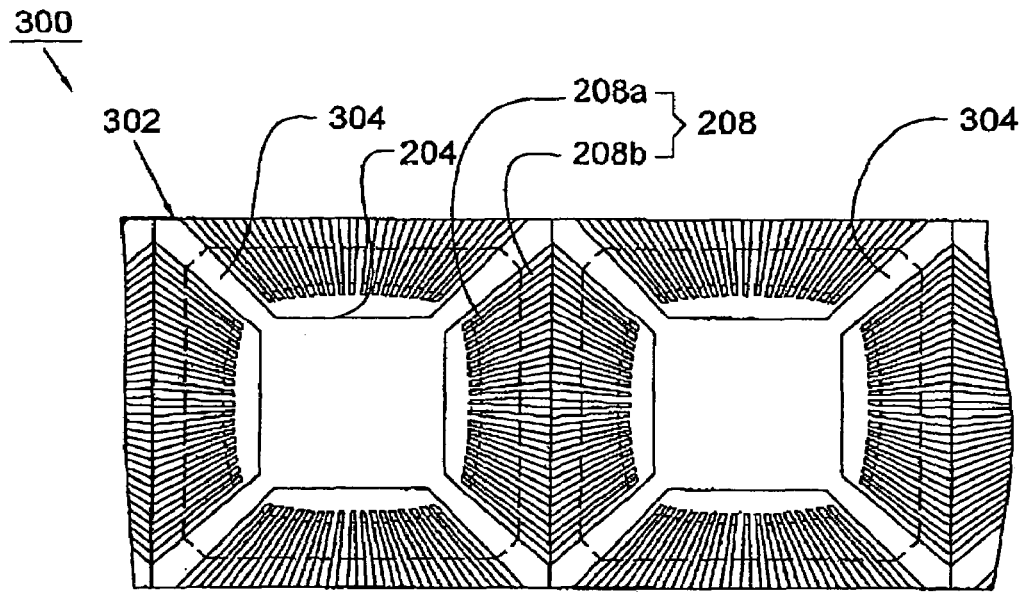
FIG. 3 shows part of the top view of the lead frame of one embodiment in accord with the present invention.
Figure 4:
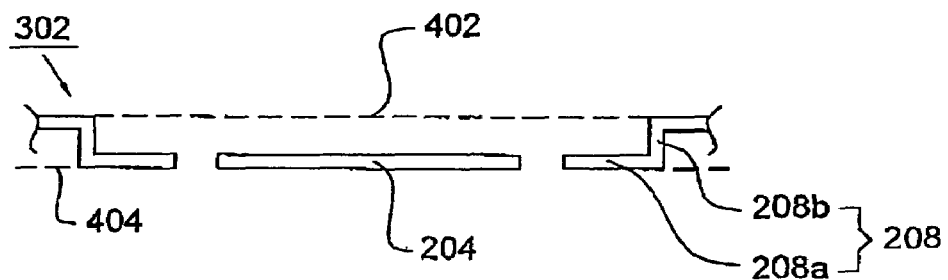
FIG. 4 shows part of the cross section of the lead frame unit of the lead frame of FIG. 3.
Figure 5:
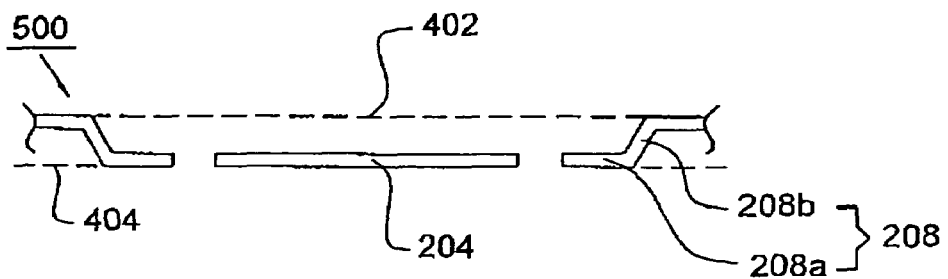
FIG. 5 shows part of the cross section of the lead frame unit of one embodiment in accord with the present invention.

FIG. 3 discloses a lead frame 300 of one embodiment in accordance with the present invention. The lead frame comprises a plurality of lead frame units 302. FIG. 4 is the cross section of a lead frame unit 302. Each lead frame unit 302 comprises a plurality of leads 208, a die pad 204 and a plurality of tie bars 304. The leads 208 are disposed in the peripheral of the die pad 204. Each lead has a first portion 208a and a second portion 208b that curves upward. The lead frame 300 forms substantially a first plane 402. The die pad 204 and the first portion 208a of the lead are located in a second plane 404. The second plane 404 is parallel to and below the plane 402 of the lead frame. In this embodiment, the first portion 208a of the lead is substantially perpendicular to the second portion that curves upward. However, referring to FIG. 5, the present invention provides another lead frame unit 500. The angle between the first portion 208a of the lead and the second portion that curves upward is an obtuse or other angle.

The present invention also provides methods for manufacturing the lead frame 300 and the semiconductor package 200. The lead frame 300 is made through etching or pressing a thin metal strip to form a similar pattern shown in FIG. 3, comprising a plurality of die pads 204 and a plurality of leads 208 with a first portion 208a and a second portion 208b. The lead frame 300 is preferably made of copper or its alloy. Besides, the lead frame 300 may also be made of iron, nickel and their alloy and then coated with a copper layer. Then, the die pad 204 and the first portion 208a of the lead 208 are recessed by, for example, a punch operation to have the die pad 204 and the first portion 208a of the lead 208 located on a plane 404. The plane 404 is parallel to and below the plane 402 of the lead frame (as shown in FIG. 4). After having a plurality of semiconductor chips 202 respectively attached to the die pads 204, the first portions 208a of the leads 208 are electrically connected to the semiconductor chip 202 by, for example, a wire bonding method. Then, a plurality of package bodies 210 is respectively formed to enclose the semiconductor chip 202 and the lead frame 300 so as to have the whole leads substantially embedded in the package body 210 with the lower surface 208d of the lead exposed outside of the package body 210. Therefore, a plurality of packages is formed. Then, a plurality of packages in the lead frame 300 is taken off by a punching method.

The package in accordance with the present invention merely needs to have the first portion of the lead of the conventional lead frame and the die pad recessed so as to form a lead frame with leads have a portion that curves upward. Therefore, the package in accordance with the present invention can use the current and well-developed bill of materials (BOM) to make the package of the present invention more price-competitive.

Figure 6:
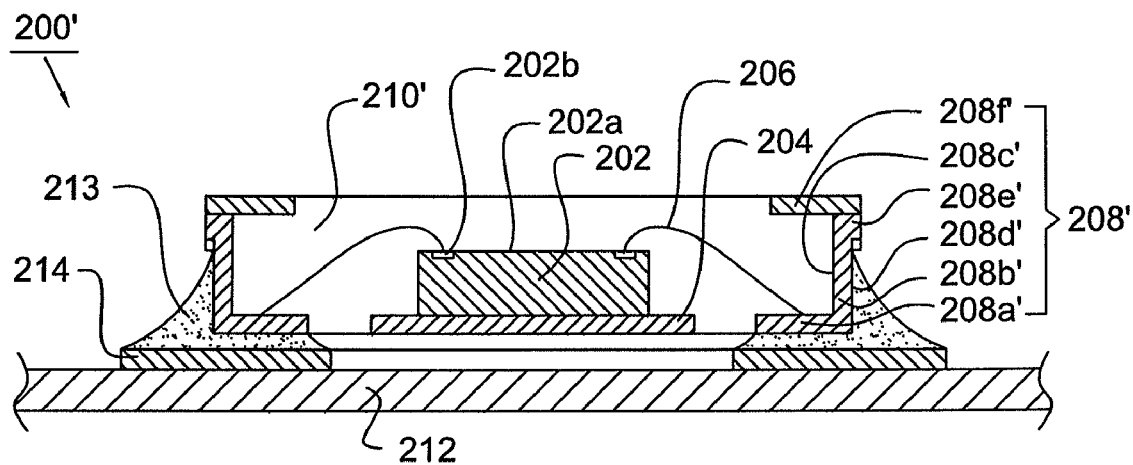
FIG. 6 is a cross-sectional view of an embodiment of a semiconductor package according to the present invention.

FIG. 6 discloses a semiconductor package 200' of one embodiment in accordance with the present invention. The package 200' shown in FIG. 6 is similar to that shown in FIG. 2, except its leads 208'. A plurality of leads 208' are placed in the periphery of the semiconductor chip 202. Each lead 208' has a first portion 208a', a second portion 208b' curving upwards, a third portion 208f over and substantially perpendicular to the second portion 208b' and opposing upper surface 208c' and lower surface 208d'. The second portion 208b' of the lead may comprise a protrusion 208e'. A package body 210' encloses the semiconductor chip 202 and leads 208', wherein the whole lead 208' is substantially embedded in the package body 210' with the lower surface 208d' of the lead 208' exposed outside of the package body 210'. Preferably, the package body 210' encloses the substantially over all surface of the protrusion 208e' so as to make the package body 210' and leads 208' combined with each other more stably. It should be noted that the lower surface of the first portion 208a' of the lead 208' is exposed on the lower surface of the semiconductor package and the lower surface 208d' of the second portion 208b of the lead 208' is exposed on a side of the semiconductor package as well as the upper surface of the third portion 208f of the lead 208' is exposed on the upper surface of the semiconductor package.

Referring to FIG. 6, a second package 200' can be stacked directly on a first package 200' mounted on the printed circuit board 212 through soldering the first portion 208a' of the second package 200' to the third portion 208f of the first package 200' as we mount a package 200' on a printed circuit board disclosed in the first embodiment of the present invention. They both form a stacked arrangement. Such stacked arrangements can make a printed circuit board accommodate more packages or shrink a printed circuit board.

Figure 7:
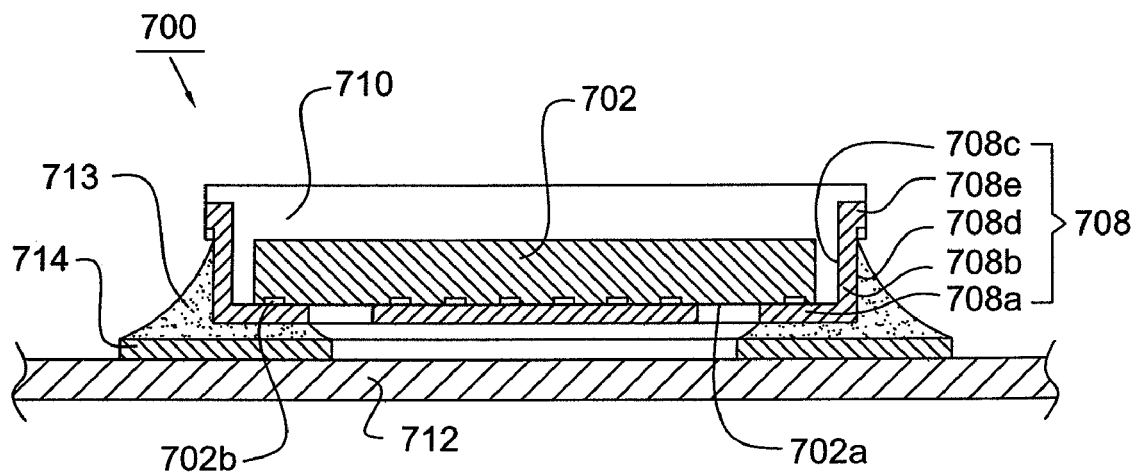
FIG. 7 is a cross-sectional view of an embodiment of a flip semiconductor chip package according to the present invention.

FIG. 7 discloses a flip semiconductor chip package 700 of one embodiment in accordance with the present invention. It comprises a flip semiconductor chip 702 that is attached to leads 708 and the die pad 704 by bumps 702c. The active area 702a of the flip semiconductor chip 702 has a plurality of bumps 702b. A plurality of leads 708 is placed in the periphery of the flip semiconductor chip 702. Each of the leads has a first portion 708a, a second portion 708b that curves upward and opposing upper surface 708c and lower surface 708d. The bumps 702b of the flip semiconductor chip 702 each attaching to the first portion 708a of the L-shaped lead 708. The second portion 708b of the lead 708 may comprise a protrusion 708e. A package body 710 encloses the flip semiconductor chip 702 and leads 708, wherein the whole lead 708 is substantially embedded in the package body 710 with the lower surface 708d of the lead 708 exposed outside of the package 710. Preferably, the package body 710 enclosed the substantially overall surface of the protrusion 708e so as to make the package body 710 and leads 708 combined with each other more stably. It should be noted that the lower surface of the first portion 708a of the lead 708 is exposed on the lower surface of the semiconductor package and the lower surface 708d of the second portion 708b of the lead 708 is exposed on a side of the semiconductor package.

Referring to FIG. 7, the first portion 708a of the lead 708 exposed in the bottom of the package 700 is mounted to the corresponding bonding pad 714 on the printed circuit board 712 by the solder 713.

Figure 8:
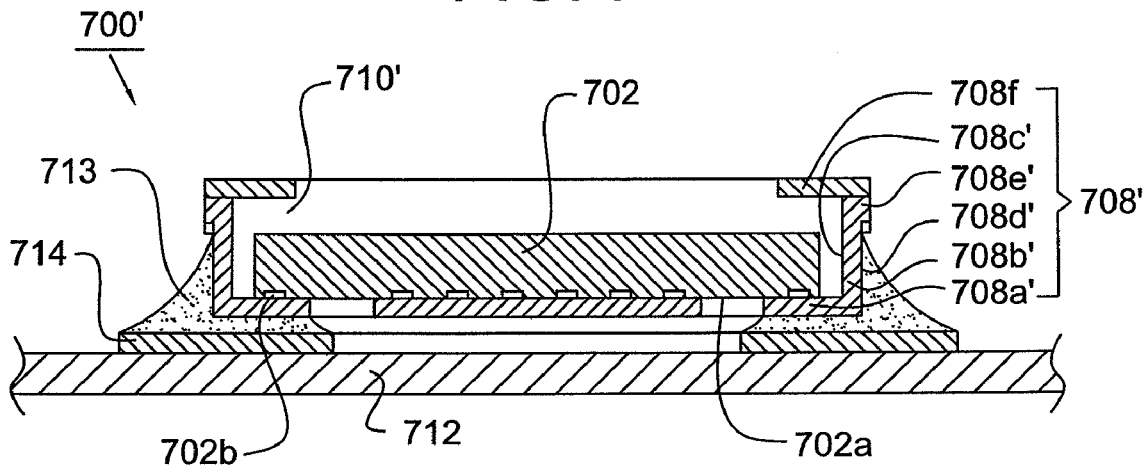
FIG. 8 is a cross-sectional view of an embodiment of a flip semiconductor chip package of according to the present invention.

FIG. 8 discloses a flip semiconductor chip package 700' of another embodiment in accordance with the present invention. A plurality of leads 708' are placed in the periphery of the flip semiconductor chip 702. Each lead 708' has a first portion 708a', a second portion 708b' curving upwards, a third portion 708f over and substantially perpendicular to the second portion 708b' and opposing upper surface 708c' and lower surface 708d'. The second portion 708b' of the lead may comprise a protrusion 708e'. A package body 710' encloses the flip semiconductor chip 702 and leads 708', wherein the whole lead 708' is substantially embedded in the package body 710' with the lower surface 708d' of the lead 708' exposed outside of the package body 710'. Preferably, the package body 710' encloses the substantially over all surface of the protrusion 708e' so as to make the package body 710' and leads 708' combined with each other more stably. It should be noted that the lower surface of the first portion 708a' of the lead 708' is exposed on the lower surface of the flip semiconductor chip package and the lower surface 708d' of the second portion 708b of the lead 708' is exposed on a side of the flip semiconductor chip package as well as the upper surface of the third portion 708f of the lead 708' is exposed on the upper surface of the flip semiconductor chip package.

Referring to FIG. 8, a second flip chip package 700' can be stacked directly on a first flip chip package 700' mounted on the printed circuit board 712 through soldering the first portion 708a' of the second flip chip package 700' to the third portion 708f of the first flip chip package 700'. They both also form a stacked arrangement.

Although the invention has been explained in relation to its preferred embodiment, it is to be understood that many other possible modifications and variations can be made without departing from the spirit and scope of the invention as hereinafter claimed.

What is claimed is:

1. A semiconductor package, comprising:
   a semiconductor chip having an active area and a plurality of bonding pads in the active area;
   a plurality of leads disposed in the periphery of the semiconductor chip, which each lead has a first portion, a second portion and opposing upper and lower surfaces, wherein the second portion of the lead curves upwards upwards and the upper surfaces of the second portions of the leads face the semiconductor chip;
   a die pad seperated from and coplanar with the first portions of the leads to carry the semiconductor chip;
   a plurality of protrusions disposed on the lower surfaces of the second portions of the leads;
   a plurality of bonding wires having seperate one ends connecting to the bonding pads of the semiconductor chip and the seperate other ends physically connecting to the first portions of the leads; and
   a package body enclosing the semiconductor chip, substantially overall surfaces of the protrusions and the leads, wherein the leads are substantially embedded in the package body with the lower surfaces of the leads exposed outside of the package body.

2. The semiconductor package as claimed in claim 1, wherein the first portion and the second portion of the lead are substantially perpendicular to each other.

3. The semiconducter package as claimed in claim 1, wherein the semiconductor package has opposing upper and lower surfaces and a plurality of side surfaces, the lower surface of the first portion of the lead is exposed on the lower surface of the semiconductor package and the lower surface of the second portion of the lead is exposed on the side surface of the semiconductor package.

4. A semiconductor package, comprising:
- a semiconductor chip having an active area and a plurality of bonding pads in the active area;
- a plurality of leads disposed in the periphery of the semiconductor chip, which each lead has a first portion, a second portion, a third portion, and opposing upper and lower surfaces, wherein the second portion of the lead curves upwards and the third portion of the lead extends horizontally from the second portion of the lead toward the semiconductor chip and the upper surfaces of the second portions of the leads face the semiconductor chip;
- a die pad separated from and coplanar with the first portions of the leads to carry the semiconductor chip;
- a plurality of protrusions disposed on the lower surfaces of the second portions of the leads;
- a plurality of bonding wires having separate one ends connecting to the bonding pads of the semiconductor chip and the separate other ends physically connecting to the first portions of the leads; and
- a package body enclosing the semiconductor chip, substantially overall surfaces of the protrusions and the leads, wherein the leads are substantially embedded in the package body with the lower surfaces and the upper surfaces of the leads exposed outside of the package body.

5. The semiconductor package as claimed in claim 4, wherein the first portion and the second portion of the lead are substantially perpendicular to each other.

6. The semiconductor package as claimed in claim 4, wherein the second portion and the third portion of the lead are substantially perpendicular to each other.

7. The semiconductor package as claimed in claim 4, wherein the semiconductor package has opposing upper and lower surface and a plurality of side surfaces, the lower surface of the first portion of the lead is exposed on the lower surface of the semiconductor package, and the lower surface of the second portion of the lead is exposed on the side surface of the semiconductor package and the upper surface of the third portion of the lead is exposed on the upper surface of the semiconductor package.

8. A flip semiconductor chip package, comprising:
- a flip semiconductor chip having an active area faced down and a plurality of bumps in the active area;
- a plurality of leads disposed in the periphery of the flip semiconductor chip, which each lead has a first portion attached to one of the bumps of the flip semiconductor chip, a second portion and opposing upper and lower surfaces, wherein the second portion of the lead curve upwards and the upper surfaces of the second portions of the leads face the flip semiconductor chip;
- a die pad separated from and coplanar with the first portions of the leads to carry the semiconductor chip;
- a plurality of protrusions disposed on the lower surfaces of the second portions of the leads; and
- a package body enclosing the flip semiconductor chip , substantially overall surfaces of the protrusions and the leads, wherein the leads are substantially embedded in the package body with the lower surfaces of the leads exposed outside of the package body.

9. The flip semiconductor chip package as claimed in claim 8, wherein the first portion and the second portion of the lead are substantially perpendicular to each other.

10. The flip semiconductor chip package as claimed in claim 8, wherein the flip semiconductor chip package has opposing upper and lower surfaces and a plurality of side surfaces, the lower surface of the first portion of the lead is exposed on the lower surface of the flip semiconductor chip package and the lower surface of the second portion of the lead is exposed on the side surface of the flip semiconductor chip package.

11. The semiconductor package as claimed in claim 1, wherein the semiconductor chip is disposed on the die pad with the active surface faced up.

12. The semiconductor package as claimed in claim 4, wherein the semiconductor chip is disposed on the die pad with the active surface faced up.

* * * * *